(12) United States Patent
Chiang et al.

(10) Patent No.: US 8,053,280 B2
(45) Date of Patent: Nov. 8, 2011

(54) METHOD OF PRODUCING MULTIPLE SEMICONDUCTOR DEVICES

(75) Inventors: Chau Fatt Chiang, Melaka (MY); Chwee Lan Lai, Johor (MY); Beng Keh See, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 378 days.

(21) Appl. No.: 12/234,192

(22) Filed: Sep. 19, 2008

(65) Prior Publication Data

US 2009/0134512 A1 May 28, 2009

Related U.S. Application Data

(63) Continuation-in-part of application No. 11/934,428, filed on Nov. 2, 2007, now abandoned.

(51) Int. Cl.
*H01L 21/44* (2006.01)
*H01L 21/48* (2006.01)
*H01L 21/50* (2006.01)

(52) U.S. Cl. . 438/114; 438/106; 438/123; 257/E21.499; 257/E23.116

(58) Field of Classification Search .................... 438/114
See application file for complete search history.

(56) References Cited

U.S. PATENT DOCUMENTS

| 6,242,283 B1 * | 6/2001 | Lo et al. | 438/106 |
| 6,979,594 B1 * | 12/2005 | Fan et al. | 438/113 |
| 2007/0164454 A1 * | 7/2007 | Andrews | 257/783 |
| 2007/0243663 A1 * | 10/2007 | Chen | 438/106 |
| 2008/0044948 A1 * | 2/2008 | Kimura | 438/114 |
| 2008/0224316 A1 * | 9/2008 | Kroeninger et al. | 257/751 |

FOREIGN PATENT DOCUMENTS

| WO | 2006079865 A1 | 8/2006 |
| WO | 2006090199 A1 | 8/2006 |

* cited by examiner

*Primary Examiner* — Phuc Dang
(74) *Attorney, Agent, or Firm* — Dicke, Billig & Czaja, PLL

(57) ABSTRACT

A method for producing multiple semiconductor devices. An electrically conductive layer is applied onto a semiconductor wafer. The semiconductor wafer is structured to produce multiple semiconductor chips. The electrically conductive layer is structured to produce multiple semiconductor devices.

17 Claims, 10 Drawing Sheets

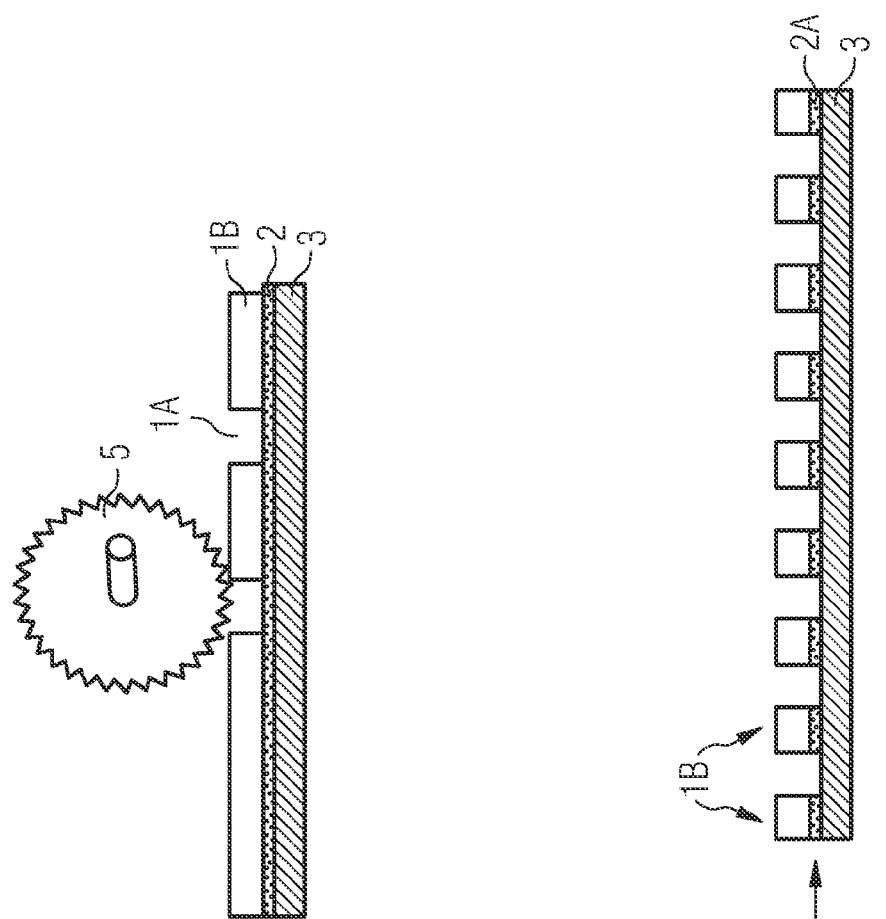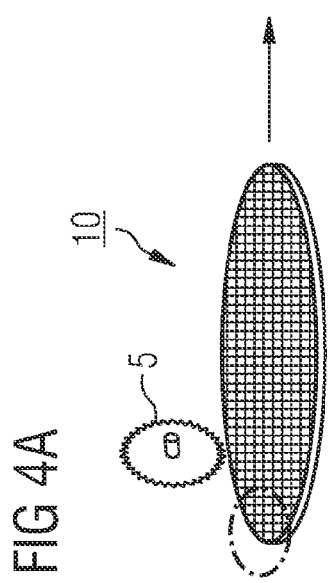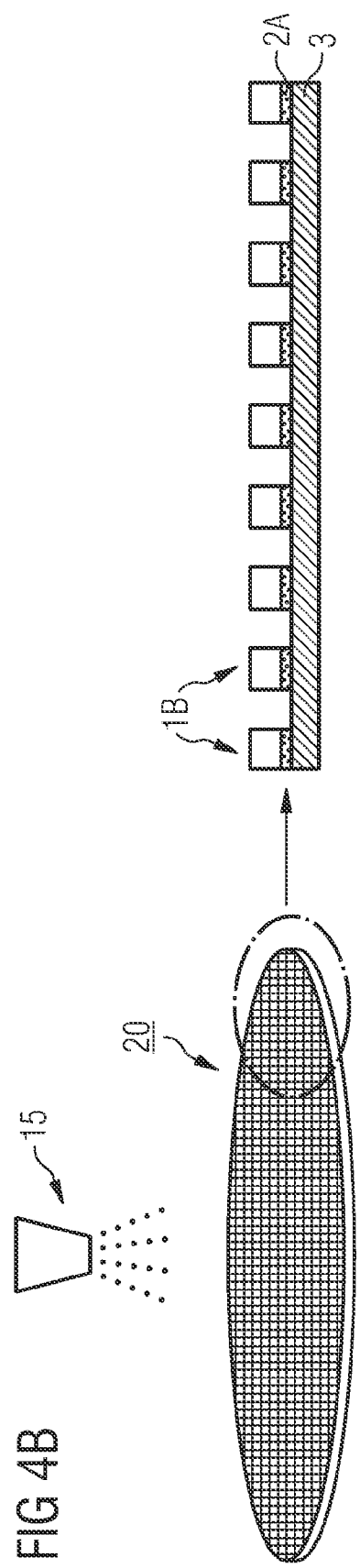

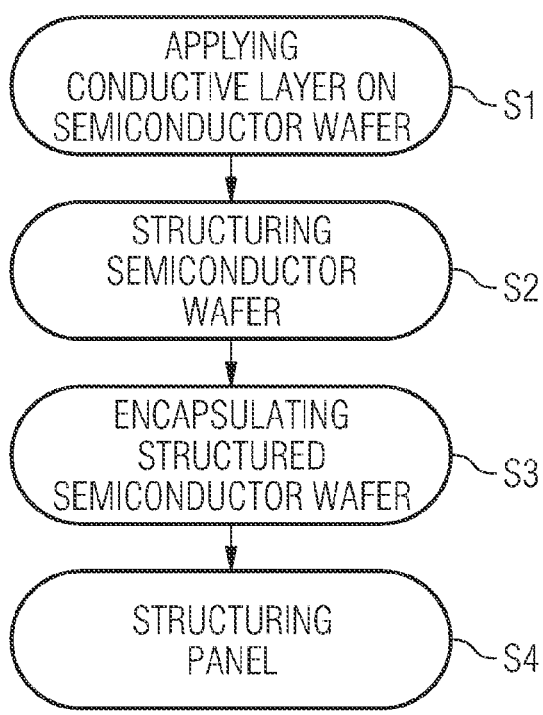
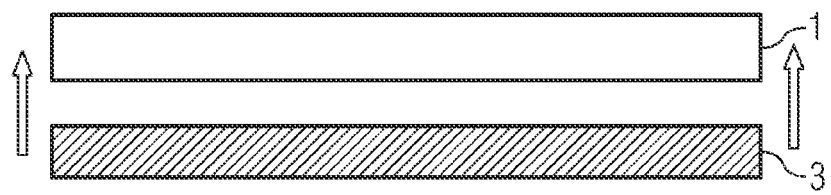
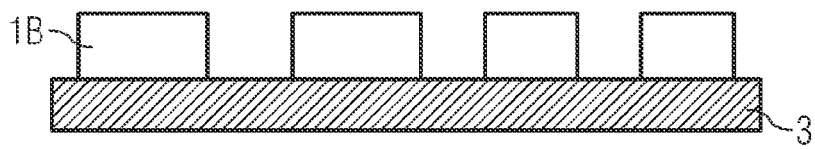
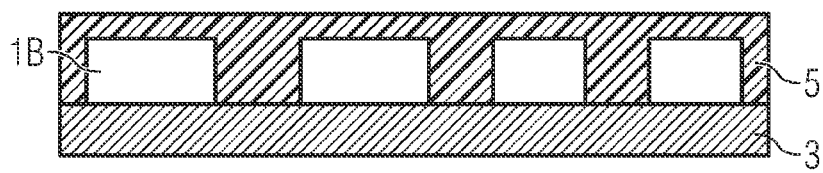
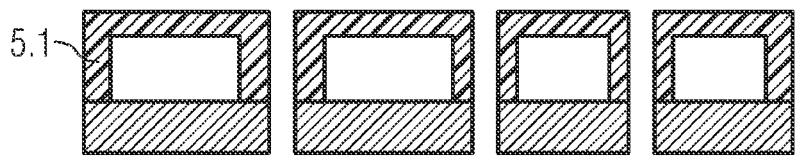

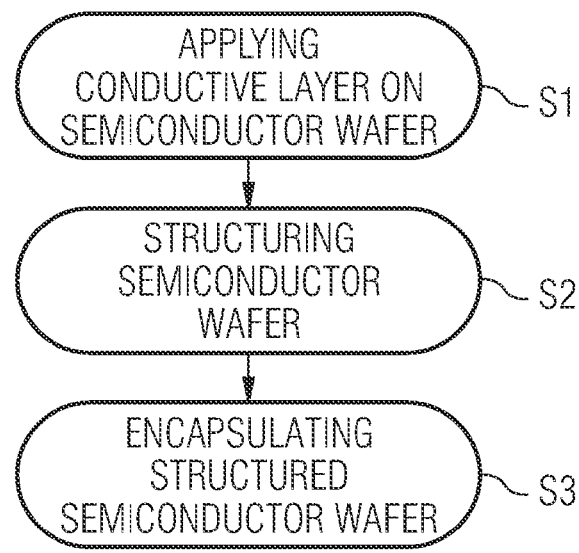
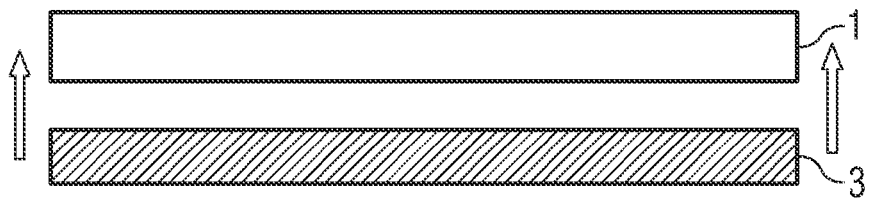
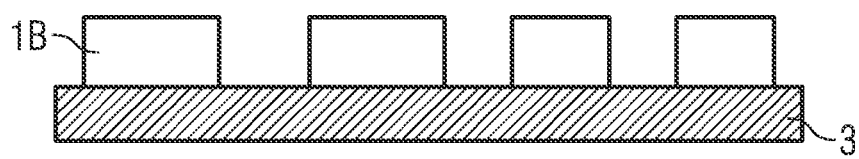
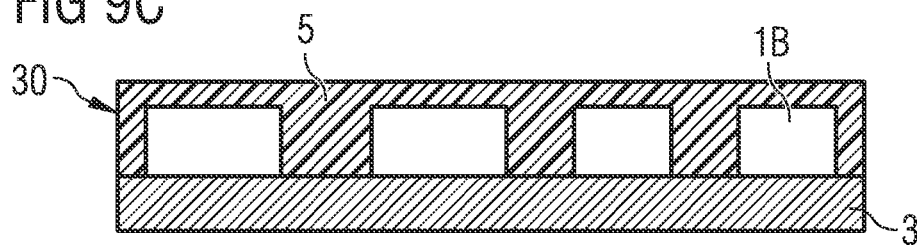

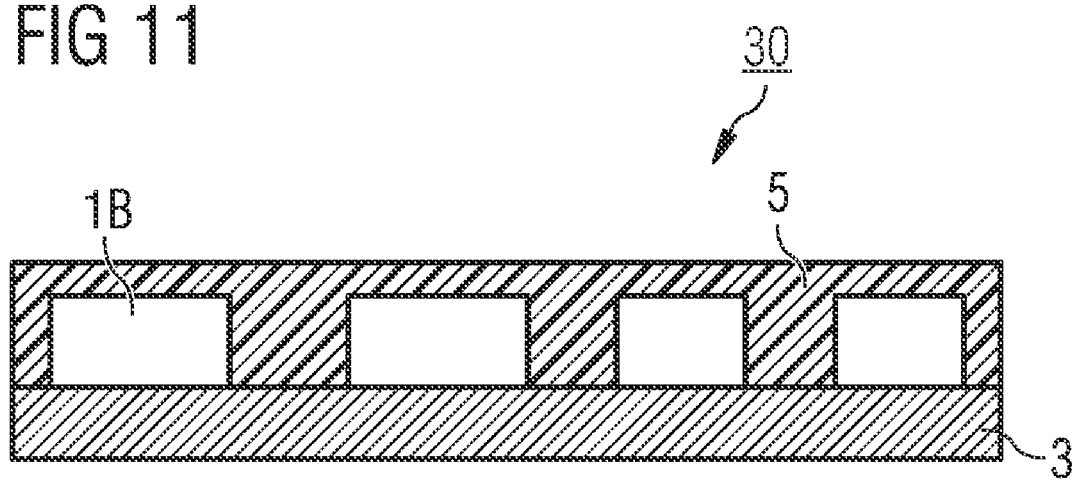
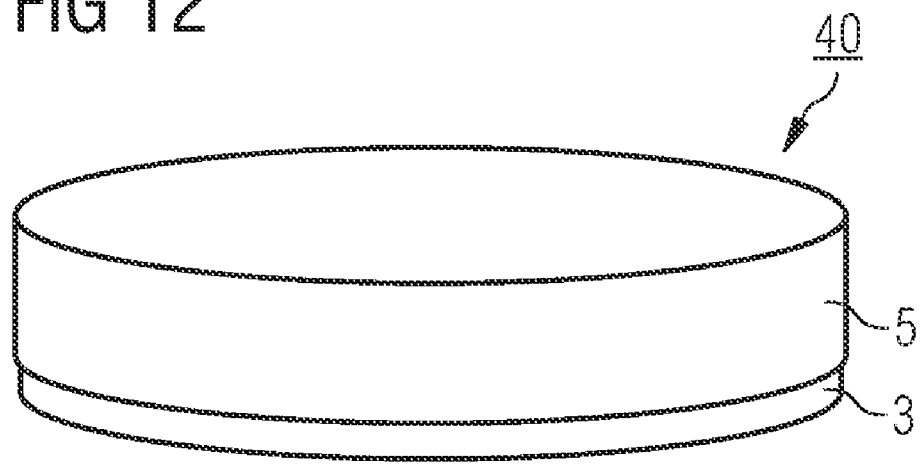

METHOD OF PRODUCING MULTIPLE SEMICONDUCTOR DEVICES

CROSS-REFERENCE TO RELATED APPLICATIONS

This Utility Patent Application is a continuation-in-part of U.S. patent application Ser. No. 11/934,428, filed Nov. 2, 2007, which is incorporated herein by reference.

BACKGROUND

The present invention relates to a method of producing multiple semiconductor devices, a method of producing multiple semiconductor packages, a method of fabricating a panel, and a panel.

Semiconductor chips include electrical contact elements on one or more of their surfaces. When fabricating a semiconductor chip package, the semiconductor chip is housed in a chip package and the contact pads of the semiconductor chip are coupled to external contact elements of the chip package.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 4A,B illustrate schematic perspective or cross-section representations of intermediate products for illustrating one embodiment of the embodiment as illustrated in FIG. 1.

FIG. 6 illustrates a flow diagram of one embodiment of a method of producing multiple semiconductor packages.

FIGS. 7A-D illustrate schematic cross-section representations of intermediate products and semiconductor packages for illustrating one embodiment of the embodiment as illustrated in FIG. 6.

FIG. 8 illustrates a flow diagram of one embodiment of a method of fabricating a panel.

FIGS. 9A-C illustrate schematic cross-section representations of intermediate products and a panel for illustrating one embodiment of the embodiment as illustrated in FIG. 7.

FIG. 11 illustrates a schematic cross-section representation of one embodiment of a panel.

FIG. 12 illustrates a schematic perspective representation of one embodiment of a panel.

DETAILED DESCRIPTION

Figure 1:
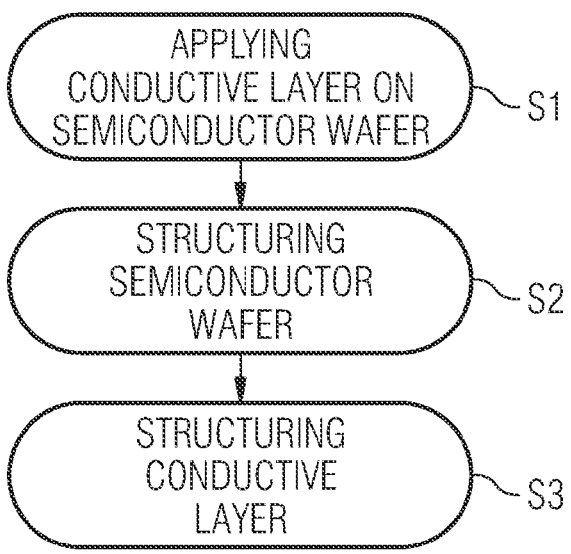
FIG. 1 illustrates a flow diagram of one embodiment of a method of producing multiple semiconductor devices.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The embodiments of a method for producing multiple semiconductor devices, of a method for producing multiple semiconductor packages, of a method for fabricating a panel and of a panel may use various types of semiconductor chips or circuits incorporated in the semiconductor chips, among them logic integrated circuits, analog integrated circuits, mixed signal integrated circuits, sensor circuits, MEMS (micro-electro-mechanical systems), power integrated circuits, chips with integrated passives etc.

In several embodiments layers or layer stacks are applied to one another or materials are applied or deposited onto layers. It should be appreciated that any such terms as "applied" or "deposited" are meant to cover literally all kinds and techniques of applying layers onto each other. They are meant to cover techniques in which layers are applied at once as a whole like, for example, laminating techniques as well as techniques in which layers are deposited in a sequential manner like, for example, sputtering, plating, molding, CVD, etc.

The semiconductor chips may include contact elements or contact pads on one or more of their outer surfaces wherein the contact elements serve for electrically contacting the semiconductor chips. The contact elements may have any desired form or shape. They can, for example, have the form of lands, i.e. flat contact layers on an outer surface of the semiconductor package. The contact elements or contact pads may be made from any electrically conducting material, e.g., from a metal as aluminum, gold, or copper, for example, or a metal alloy, or an electrically conducting organic material, or an electrically conducting semiconductor material.

The semiconductor chips may be covered with a material layer or encapsulation layer. The material of the material layer can be any electrically insulating material like, for example, any kind of molding material, any kind of epoxy material, or any kind of resin material or any kind of polymer material. The process of applying the material layer can be any process like, for example, a molding process, such as a compression molding process, or a casting process.

FIG. 1 illustrates a flow diagram of one embodiment of a method of producing multiple semiconductor devices. The method includes applying an electrically conductive layer onto a semiconductor wafer (s1), structuring the semiconductor wafer to produce multiple semiconductor chips (s2), and structuring the electrically conductive layer to produce multiple semiconductor devices (s3).

According to one embodiment structuring the semiconductor wafer includes at least one of structuring the semiconductor wafer by etching, by sawing, by laser beam irradiation, and by charged particle beam irradiation.

According to one embodiment the method further includes structuring the electrically conductive layer to produce multiple contact elements for each semiconductor device.

According to one embodiment the method further includes structuring the electrically conductive layer after structuring the semiconductor wafer.

According to one embodiment structuring the electrically conductive layer includes at least one of structuring the electrically conductive layer by etching, by sawing, by laser beam irradiation, and by charged particle beam irradiation.

According to one embodiment the method further includes wire bonding the semiconductor chips before structuring the electrically conductive layer.

According to one embodiment the method further includes encapsulating the semiconductor chips with an encapsulation material before structuring the electrically conductive layer.

According to embodiments the electrically conductive layer can be applied by different processes to the second surface of the semiconductor wafer. In one embodiment the electrically conductive layer can be provided as a self-stable sheet like, for example, a metal sheet and it can be attached to the second surface of the semiconductor wafer as a hole by using, for example, an adhesive substance. In one embodiment the electrically conductive layer can be deposited or coated on to or above the second surface of the semiconductor wafer by using any known deposition or coating techniques like, for example, sputtering, plating, chemical or physical vapor deposition, etc.

According to one embodiment the electrically conductive layer can be applied by using an adhesive substance. The adhesive substance can be applied as an adhesive layer to one or both of the semiconductor wafer and the electrically conductive layer. Afterwards the semiconductor wafer and the electrically conductive layer can be attached to one another so that the adhesive substance or the adhesive layer is disposed between the semiconductor wafer and the electrically conductive layer.

Figure 2A:
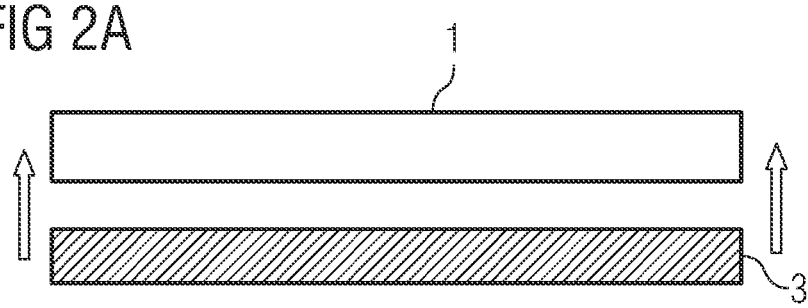
FIGS. 2A-C illustrate schematic cross-section representations of intermediate products and semiconductor devices for illustrating an embodiment of one embodiment as illustrated in FIG. 1.
Figure 2B:
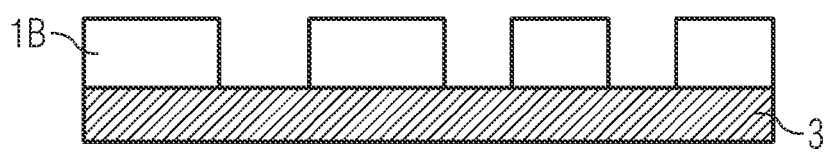
Figure 2C:
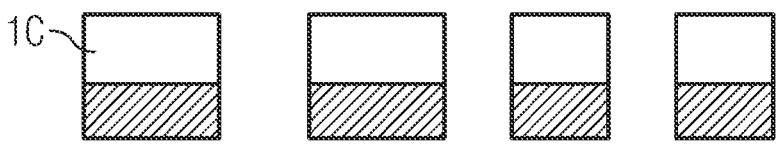

Referring to FIGS. 2A-C there are illustrated schematic cross-section representations of intermediate products and semiconductor devices for illustrating one embodiment of the embodiment as illustrated in FIG. 1. FIG. 2A illustrates the applying of an electrically conductive layer 3 to a semiconductor wafer 1. FIG. 2B illustrates a result after structuring of the semiconductor wafer 1 obtaining multiple semiconductor chips 1B. FIG. 2C illustrates the structuring of the electrically conductive layer obtaining multiple semiconductor devices 1C.

Figure 3A:
FIGS. 3A-D illustrate schematic perspective or cross-section representations of intermediate products for illustrating one embodiment of the embodiment as illustrated in FIG. 1.

Referring to FIGS. 3A-D, there are illustrated schematic perspective and cross-section representations of intermediate products for illustrating an embodiment of a method of producing multiple semiconductor chips. In FIG. 3A a perspective representation of a semiconductor wafer 1 is illustrated. The semiconductor wafer 1 can, for example, be a silicon wafer. However, it can also be a semiconductor wafer of any other element or compound semiconductor material like, for example, SiGe, Ge, GaAs, GaN, or any other semiconductor material.

The semiconductor wafer 1 can include a plurality of integrated circuits (not illustrated) fabricated at and adjacent to one of the main surfaces of the semiconductor wafer 1. The integrated circuits can essentially be fabricated according to any conventional fabrication method like, for example, conventional mask and photolithography processing, in one embodiment in the form of a wafer-stepper method. As a result, the semiconductor wafer 1 may include a plurality of identical integrated circuits. However, it may also be the case that two or more integrated circuits of different functionality are grouped together and a plurality of such groups of integrated circuits is fabricated.

Figure 3B:
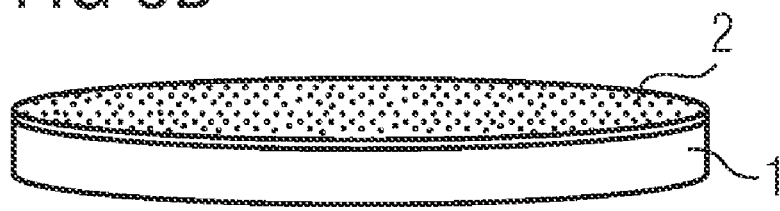

Referring to FIG. 3B, the application of an adhesive layer 2 is illustrated. If we assume that the integrated circuits are fabricated at and adjacent to a first main surface of the semiconductor wafer 1, then the adhesive layer 2 is applied onto a second surface of the semiconductor wafer 1 opposite to the first surface. The adhesive layer 2 can be applied by use of a screen or stencil printing process and subsequent drying. However, the adhesive layer 2 can also have the form of an adhesive double-sided foil which is provided in a pre-fabricated state and laminated as a whole onto the second surface of the semiconductor wafer 1.

The first surface of the semiconductor wafer 1 may be called the front side as the integrated circuits are applied at and adjacent to the first surface. The second surface of the semiconductor wafer 1 may thus be called the backside of the semiconductor wafer 1. According to one embodiment of applying the adhesive substance or the adhesive layer 2 to the semiconductor wafer 1, wafer backside coating (WBC) can be employed. In WBC the adhesive substance is supplied as a specifically designed paste, which is applied to the backside of the semiconductor wafer 1 and dried. The adhesive paste can be applied quickly using a screen-printing platform such as those used in surface-mount production lines to deposit solder paste. The platforms are readily available at reasonable costs, and deliver sufficient accuracy and repeatability to enable complete coverage of the wafer with minimal waste. Using such a printer, a concentric adhesive layer 2 can be deposited on the wafer backside with little variation in thickness. The entire process typically takes 10-15 sec to complete, using a suitable combination of stencil and squeegee. An emulsion screen may provide a suitable alternative to a metal stencil depending on the adhesive characteristics.

Figure 3C:
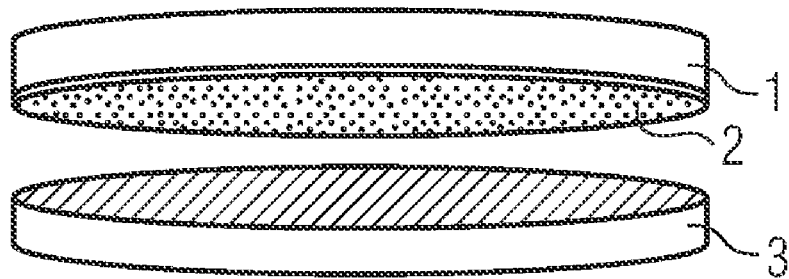

Referring to FIG. 3C, the process of applying an electrically conductive layer 3 to the semiconductor wafer 1 is illustrated in a schematic perspective representation. The electrically conductive layer 3 can be a self-stable and self-handable sheet which can be fabricated out of any electrically conductive material like, for example, an elemental metal as copper, gold, nickel, aluminum or a metal alloy, or an electrically conducting organic material, or an electrically conducting semiconductor material. The electrically conductive layer 3 can also include one or more of the above-mentioned materials in the form of, for example, a layer stack. The electrically conductive layer 3 may have a rigid property or in one embodiment may have a flexible property.

Figure 3D:
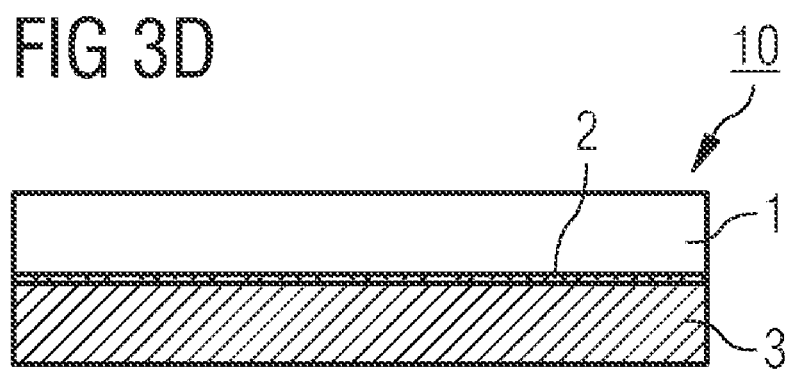

Referring to FIG. 3D, there is illustrated in a side view or a cross-sectional view an embodiment of an intermediate product including the semiconductor wafer 1, the electrically conductive layer 3 and the adhesive layer 2 in-between the semiconductor wafer 1 and the electrically conductive layer 3.

It is to be noted that the representations of the various layers in FIGS. 3A-D are not necessarily to scale. From the representation of FIG. 3C it appears that the electrically conductive layer 3 has a thickness which is less than the thickness of the semiconductor wafer 1. However, it may also be possible that the electrically conductive layer 3 has a thickness which is greater than the thickness of the semiconductor wafer 1. Whereas the semiconductor wafer may have a thickness in the range from 150 µm to 450 µm, the thickness of the electrically conductive layer 3 may be within a broad range from 5 µm to 500 µm.

According to one embodiment according to FIGS. 3A-D, a pre-fabricated electrically conductive layer 3 is used and applied as a whole to the semiconductor wafer 1. However, according to another embodiment it is also possible that the electrically conductive layer 3 is applied in a sequential manner to the back surface of the semiconductor wafer 1. The electrically conductive layer 3 can, for example, be deposited by a sputtering process or by a chemical vapor deposition (CVD) process or by a plating process, wherein the plating can be an electrochemical plating or an electrode-less plating process. As a further alternative, the electrically conductive layer 3 can be deposited by using an MICC (metal-induced crystallization using a cap) process.

Referring to FIGS. 4A,B, there are illustrated schematic perspective and cross-sectional views of intermediate products in order to illustrate one embodiment of the method as illustrated in FIGS. 1 and 2. In this embodiment an example for the structuring of the semiconductor wafer is illustrated. The structuring is carried out by removing predetermined first regions of the semiconductor wafer between predetermined second regions containing the integrated circuits. The process of removing the first regions is illustrated schematically in FIG. 4A. In the left partial picture of FIG. 4A an intermediate product 10 is illustrated as obtained, for example, according to one embodiment of FIGS. 3A-D. There is also illustrated schematically a saw 5 which can be, for example, a jig saw. The jig saw 5 is employed for sawing out the predetermined first regions of the semiconductor wafer. This is illustrated in further detail in the right partial picture of FIG. 4A which illustrates an enlarged section as indicated by the encircling hatched oval in the left partial picture of FIG. 4A. The second regions 1B are those regions containing the integrated circuits and the second regions 1B are supposed to be further processed to become semiconductor chips and semiconductor chip packages, respectively. Therefore, the second regions 1B are separated from each other on the level of the semiconductor wafer 1. The second regions 1B may contain only one integrated circuit. However, it is also possible that the second regions 1B each contain two integrated circuits wherein, for example, a first circuit is comprised of a sensor circuit and a second circuit is comprised of a processor circuit.

One embodiment as illustrated in FIG. 4A, B corresponds to the embodiment as illustrated in FIGS. 3A-D wherein the electrically conductive layer 3 is applied to the semiconductor wafer 1 by using an intermediate adhesive layer 2. It should be noted, however, that the adhesive layer 2 is not necessarily present in cases, for example, in which the electrically conductive layer 3 is applied to the semiconductor wafer 1 by other means without using an adhesive layer 2.

According to one embodiment of FIGS. 4A,B the first regions between the second regions 1B are removed by sawing into the semiconductor wafer 1 down to the adhesive layer 2 leaving empty spaces 1A where the first regions had been before. Below the empty spaces 1A there is still the adhesive layer 2 as it is not removed by the saw 5.

In FIG. 4B it is illustrated how those portions of the adhesive layer lying below the empty spaces 1A are removed. In the left partial picture of FIG. 4B a perspective view of an intermediate product 20 is illustrated as it is obtained after sawing out the first regions as illustrated in FIG. 4A. Also illustrated in the left partial picture of FIG. 4B is a dispensing unit 15 for dispensing hot IPA (isopropyl alcohol) and DI (de-ionized) water in order to remove the adhesive residue of the adhesive layer 2 in the regions below the empty spaces 1A.

The dispensing unit 15 can be arranged and controlled such that flashing with hot IPA and DI water is carried out. The hot IPA and the DI water also serves for removing the dust as has been left from the sawing process of FIG. 4A.

In the right partial picture of FIG. 4B a detailed cross-sectional view of the right portion of the intermediate product 20 is illustrated as indicated in the left partial picture of FIG. 4B with the encircling hatched oval. As a result the second portions 1B are still coupled with the electrically conductive layer 3 by remaining portions 2A of the adhesive layer 2.

Referring again to the right partial picture of FIG. 4B, there is illustrated a cross-sectional representation of an intermediate product 20. The intermediate product 20 includes a plurality of semiconductor chips 1B each having a first surface and a second surface, respectively, and a cohesive electrically conductive layer 3 applied to the first surfaces of the semiconductor chips 1B.

Figure 5A:
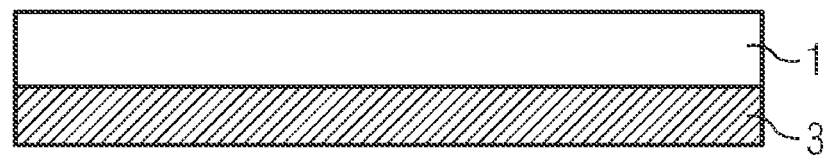
FIG. 5A-D illustrate schematic cross-section or top view representations of intermediate products for illustrating one embodiment of the embodiment as illustrated in FIG. 1.
Figure 5B:
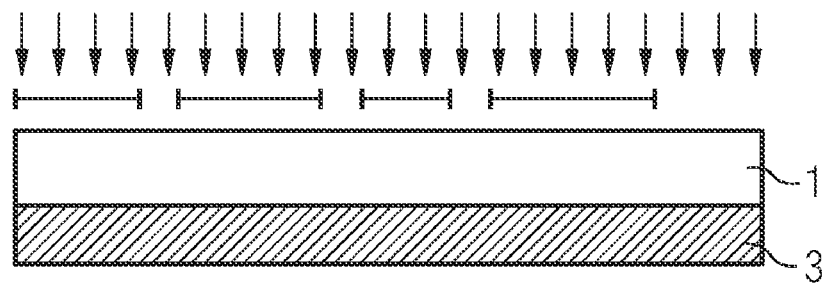
Figure 5C:
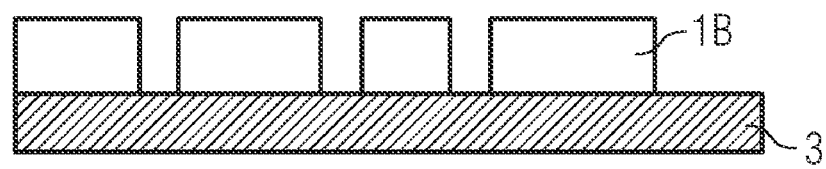
Figure 5D:
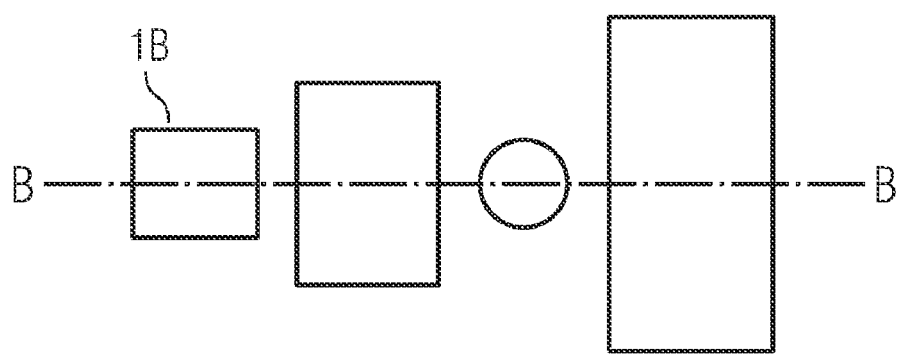

Referring to FIGS. 5A-C, there are illustrated cross-sectional and top views of intermediate products in order to illustrate an embodiment of the method as illustrated in FIGS. 1 and 2. In one embodiment as of FIGS. 4A,B it has been illustrated that the production of the semiconductor chips by structuring of the semiconductor wafer can be carried out by sawing. When identical chips are to be produced with equal distances from each other arranged, for example, in the form of a regular array, sawing is a practical and efficient solution as only one particular saw tooth blade width is required and by sawing the material can be removed very rapidly. However, in a case in which chips of different forms and with varying distances from each other are required, sawing might not be the best solution. FIGS. 5A-C illustrate that in this embodiment etching could be the most adequate method for structuring of the semiconductor wafer. FIG. 5A illustrates a cross-section representation of an intermediate product including the semiconductor wafer 1 attached to the electrically conductive layer 3. In the lower partial picture of FIG. 5C a top view of the structured semiconductor wafer 1 is illustrated in which along line B-B chips of different form and with different and varying distances from each other are illustrated. FIG. 5B is a cross-section representation along line B-B of FIG. 5C and it illustrates how the structuring by etching can be performed. Above the intermediate product as of FIG. 5A an etching mask is arranged, the etching mask having mask portions corresponding to the desired forms of the semiconductor chips and openings for those portions to be removed between the chips. Then an isotrope etching process like, for example, reactive ion etching (RIE) or reactive ion beam etching (RIBE) is performed by directing an etching substance from above the mask through the mask openings onto the semiconductor wafer. The result is illustrated in the upper partial picture of FIG. 5C and the lower partial picture illustrates the structured semiconductor wafer. According to an embodiment the etching mask can also be formed as a structured mask layer of a material like, for example, SiN produced by photolithographical structuring on the upper surface of the semiconductor wafer and removed after the etching process. In one embodiment, etching can be advantageous as compared to sawing as it is a parallel process while sawing is a serial process. One further advantage of etching is that regions can be removed where a chip is to be bonded to a neighboring metal region.

Referring to FIG. 6, there is illustrated a flow diagram of one embodiment of a method of producing multiple semiconductor packages, the method including applying an electrically conductive layer onto a semiconductor wafer (s1), structuring the semiconductor wafer to produce multiple semiconductor chips (s2), encapsulating the structured semiconductor wafer with an encapsulation material to produce a panel (s3), and structuring the panel to produce multiple semiconductor packages (s4).

According to one embodiment of the embodiment of FIG. 6, structuring of the semiconductor wafer includes at least one of structuring the semiconductor wafer by etching, by sawing, by laser beam irradiation, and by charged particle beam irradiation. In one embodiment, the method as described in connection with FIG. 5A-C can also be applied to one embodiment of FIG. 6.

According to one embodiment of the embodiment of FIG. 6, structuring of the panel includes at least one of structuring the panel layer by etching, by sawing, by laser beam irradiation, and by charged particle beam irradiation.

According to one embodiment of the embodiment of FIG. 6, the method further includes wire bonding the semiconductor chips to the electrically conductive layer.

According to one embodiment of the embodiment of FIG. 6, the method further includes structuring of the panel includes structuring the electrically conductive layer.

According to one embodiment of the embodiment of FIG. 6, the further includes structuring the electrically conductive layer to produce multiple contact elements in each semiconductor package.

As designated with reference sign s3, an encapsulating material is applied to the structured semiconductor wafer. According to one embodiment applying of the encapsulating material layer can include molding wherein a suitable mold material will be used. The potential mold materials include, for example, aliphatic and aromatic polymers including thermoplastic and thermoset type polymers and blends of these and also other various types of polymers. After molding the material layer the mold compound will normally be cured and hardened.

According to one embodiment of the method to produce multiple semiconductor chip packages, the chips can be electrically coupled with predetermined regions of the electrically conductive layer. Such predetermined regions of the electrically conductive layer will become the outer electrical contact elements ("lands") of the semiconductor chip packages to be fabricated. Before or after electrically connecting the chips with the predetermined regions of the electrically conductive layer, the predetermined regions can be isolated from the remaining part of the electrically conductive layer, respectively. This can be done by removing predetermined portions of the electrically conductive layer so that essentially only the predetermined regions and the regions supporting the semiconductor chips remain.

Referring to FIGS. 7A-D there are illustrated schematic cross-section representations of intermediate products and semiconductor packages for illustrating one embodiment of the embodiment of a method as illustrated in FIG. 6. FIG. 7A illustrates the applying of an electrically conductive layer 3 to a semiconductor wafer 1. FIG. 7B illustrates an intermediate product after structuring of the semiconductor wafer 1 obtaining multiple semiconductor chips 1B. FIG. 7C illustrates encapsulating of the structured wafer with an encapsulation material 5 thus forming a panel. FIG. 7D illustrates structuring of the panel for obtaining multiple semiconductor packages 5.1.

Referring to FIG. 8, there is illustrated a flow diagram of one embodiment of a method of fabricating a panel, the method including applying an electrically conductive layer onto a semiconductor wafer (s1), structuring the semiconductor wafer to produce multiple semiconductor chips (s2), and encapsulating the structured semiconductor wafer with an encapsulation material to produce a panel (s3).

According to one embodiment of the embodiment of FIG. 8, structuring of the semiconductor wafer includes at least one of structuring the semiconductor wafer by etching, by sawing, by laser beam irradiation, and by charged particle beam irradiation.

As designated with reference sign s3, an encapsulating material is applied to the structured semiconductor wafer. According to one embodiment applying of the encapsulating material layer can include molding wherein a suitable mold material will be used. The potential mold materials include, for example, aliphatic and aromatic polymers including thermoplastic and thermoset type polymers and blends of these and also other various types of polymers. After molding the material layer the mold compound will normally be cured and hardened.

Referring to FIGS. 9A-C there are illustrated schematic cross-section representations of intermediate products and a panel for illustrating one embodiment of the embodiment of a method as illustrated in FIG. 8. FIG. 9A illustrates the applying of an electrically conductive layer 3 to a semiconductor wafer 1. FIG. 9B illustrates an intermediate product after structuring of the semiconductor wafer 1 obtaining multiple semiconductor chips 1B. FIG. 9C illustrates the encapsulating of the structured wafer with an encapsulation material 5 thus forming a panel 30.

Referring to FIGS. 10A-I, there are illustrated schematic cross-sectional representations of sections of intermediate products being processed in order to fabricate single semiconductor chip packages. It is to be noted that for illustration purposes in each one of the representations of FIGS. 10A-I there are illustrated two semiconductor chips of the plurality of semiconductor chips of the panel, wherein the two semiconductor chips are to be housed each one in an own semiconductor chip package.

Figure 10A:
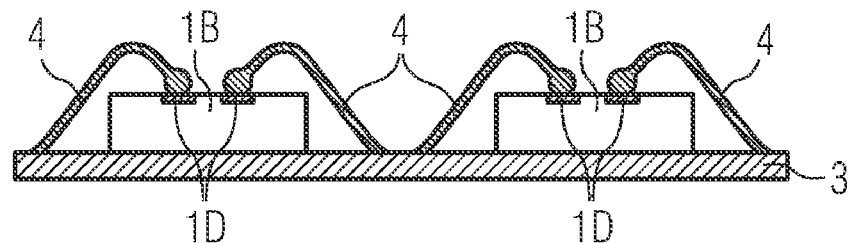
FIGS. 10A-I illustrate schematic cross-section representations of intermediate products, panels and a semiconductor chip packages for illustrating one embodiment of the method as illustrated in one of FIGS. 1 to 9.

Referring to FIG. 10A, the two semiconductor chips 1B are illustrated attached to the electrically conductive layer 3 as was obtained, for example, according to the embodiment as described above in connection with FIGS. 2A-C. The semiconductor chips 1B can be attached to the electrically conductive layer 3 by using an adhesive layer which is not illustrated in the representation of FIG. 10A. The electrically conductive layer 3 can be of any material and constitution as was outlined further above. It can be, for example, a sheet of copper material.

FIG. 10A also illustrates that the semiconductor chips 1B each include two contact pads 1D, respectively. The contact pads 1D are coupled via bond wires 4 to predetermined areas of the electrically conductive layer 3, wherein the predetermined areas of the electrically conductive layer 3 are supposed to become outer electrical contact elements of the semiconductor chip package to be fabricated.

Figure 10B:
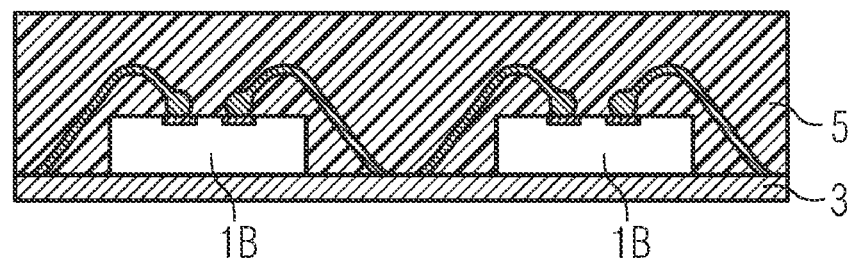

Referring to FIG. 10B, the intermediate product is illustrated after completion of a further process. In this process a material or encapsulation layer 5 is applied to the semiconductor chips 1B so that the material layer 5 covers and embeds the semiconductor chips 1B and the bond wires 4 and the electrically conductive layer 3, i.e. those portions of the electrically conductive layer 3 which are not occupied with semiconductor chips 1B.

The material layer 5 can be applied by molding, in one embodiment compression molding. The form used for the compression molding can have an interior cavity corresponding to the size of the wafer. Referring to FIG. 12 a schematic perspective view is illustrated of the total embedded wafer after applying of the encapsulating material 5 which can be a mold material. FIG. 12 illustrates a panel 40 obtained after carrying out the molding with the mold material layer 5.

Figure 10C:
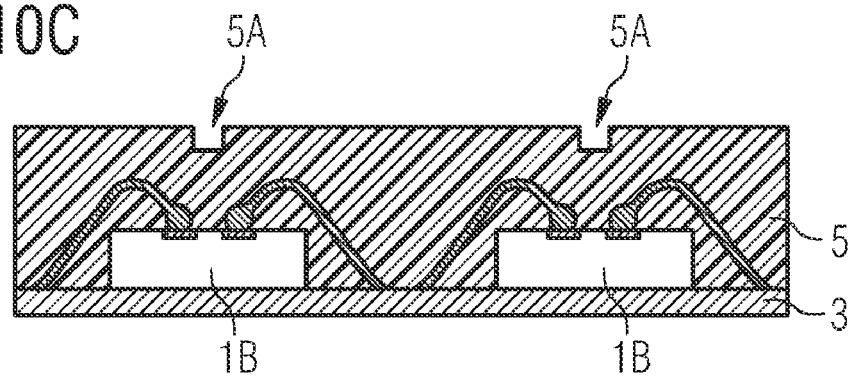

Referring to FIG. 10C, the individual units to become individual chip packages are marked on the upper surface of the material layer 5. For this purpose small grooves 5A are generated with a laser beam by laser ablation of the material layer 5 at predetermined regions of its upper surface.

Figure 10D:
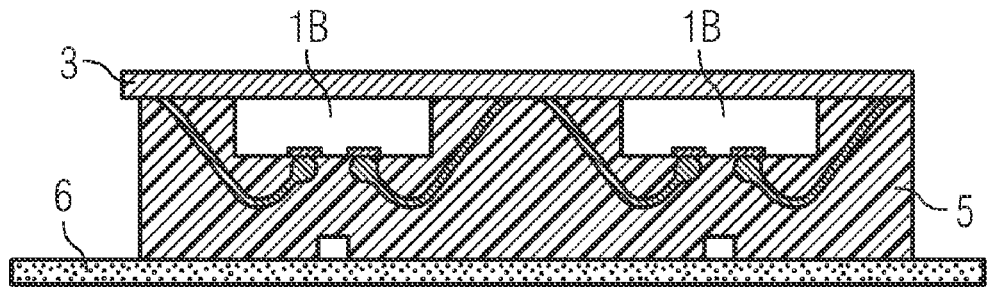

Referring to FIG. 10D, an adhesive tape 6 is fixed to the upper surface of the material layer 5 opposite to the electrically conductive layer 3. The adhesive type 6 has the function of a package lamination tape as in the next process following FIG. 10D the packages are to be singulated.

Figure 10E:
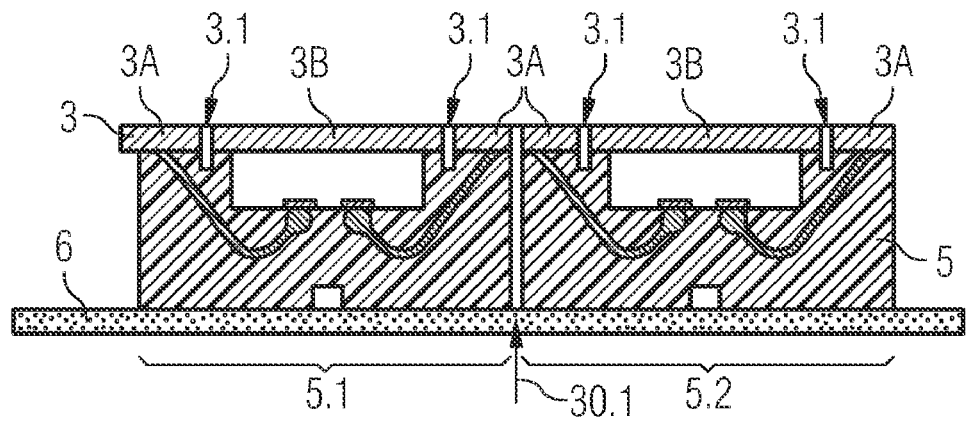

Referring to FIG. 10E, the plurality of the individual packages are singulated from the panel 30. This is carried out by sawing the panel 30 and a plurality of lines 30.1. In FIG. 10E one of such lines 30.1 is illustrated positioned between the two semiconductor chip packages. The plurality of packages are still attached to the adhesive type 6 after the package singulation process. At the same time when sawing along the lines 30.1 and singulating the packages, the electrically conductive layer can be sawn at lines 3.1 and thus separated into several different regions 3A, 3B which are isolated from each other. The regions 3A are coupled each one with one of the wire bonds and the regions 3A function as outer electrical contact elements of the semiconductor chip packages. The region 3B functions as the carrier of the semiconductor chip. However, in principle it is also possible that the semiconductor chip includes a contact element at its first surface being in contact with the carrier 3B so that as well the carrier 3B may function as an outer electrical contact element for contacting the semiconductor chip. With the singulating process as illustrated in FIG. 10E two individual semiconductor chip packages 5.1 and 5.2 are fabricated.

Figure 10F:
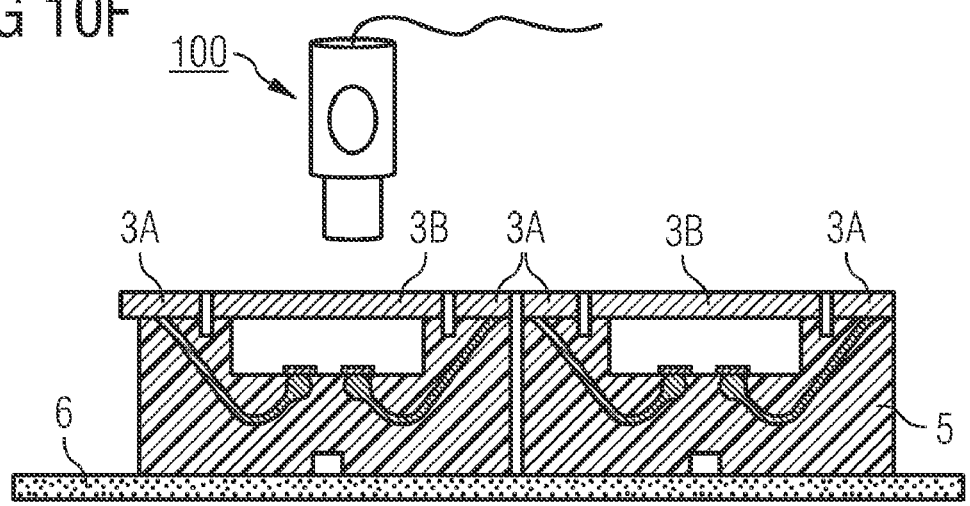

Referring to FIG. 10F, the assembly of singulated semiconductor chip packages attached to the adhesive tape 6 undergoes an optical and visual inspection by use of a video inspection system 100.

Figure 10G:
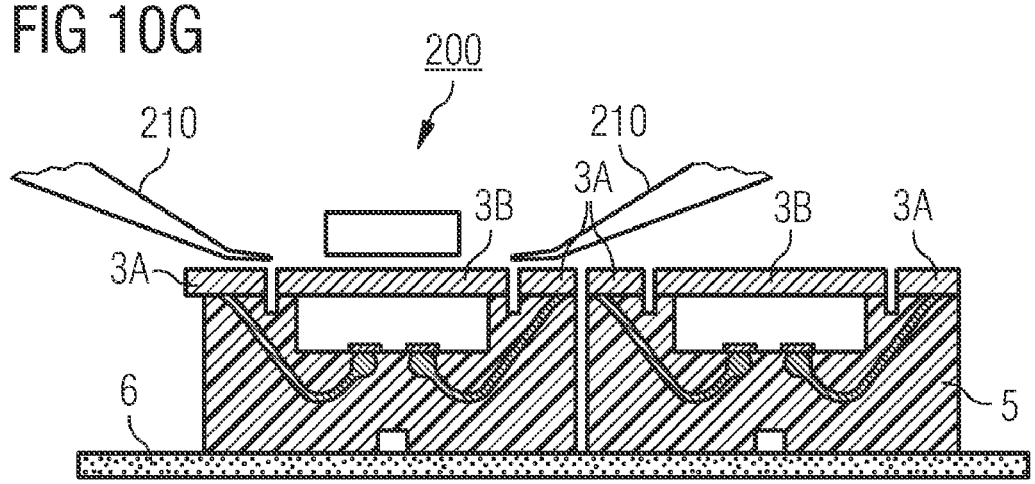

Referring to FIG. 10G, the assembly consisting of singulated semiconductor chip packages attached to the adhesive tape 6 undergoes electrical testing by use of an electrical testing system 200 having, for example, probes 210.

Figure 10H:
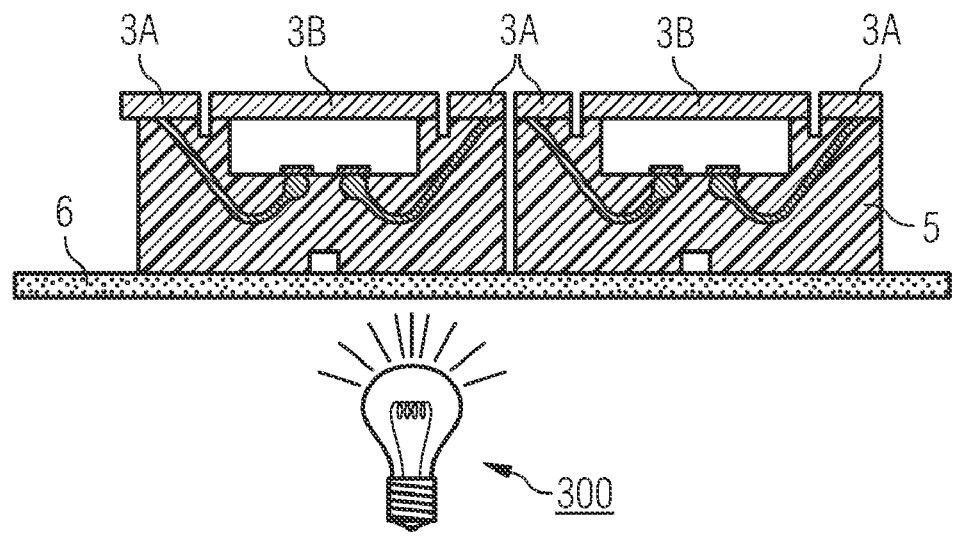

Referring to FIG. 10H, the adhesive tape 6 is then removed from the plurality of semiconductor chip packages. This can be easily performed by irradiating the adhesive tapes 6 with UV radiation which enables the adhesive tape to be cleanly removed from the mold material layer 6 of the individual semiconductor chip packages. The UV illumination system is designated with reference sign 300.

Figure 10I:
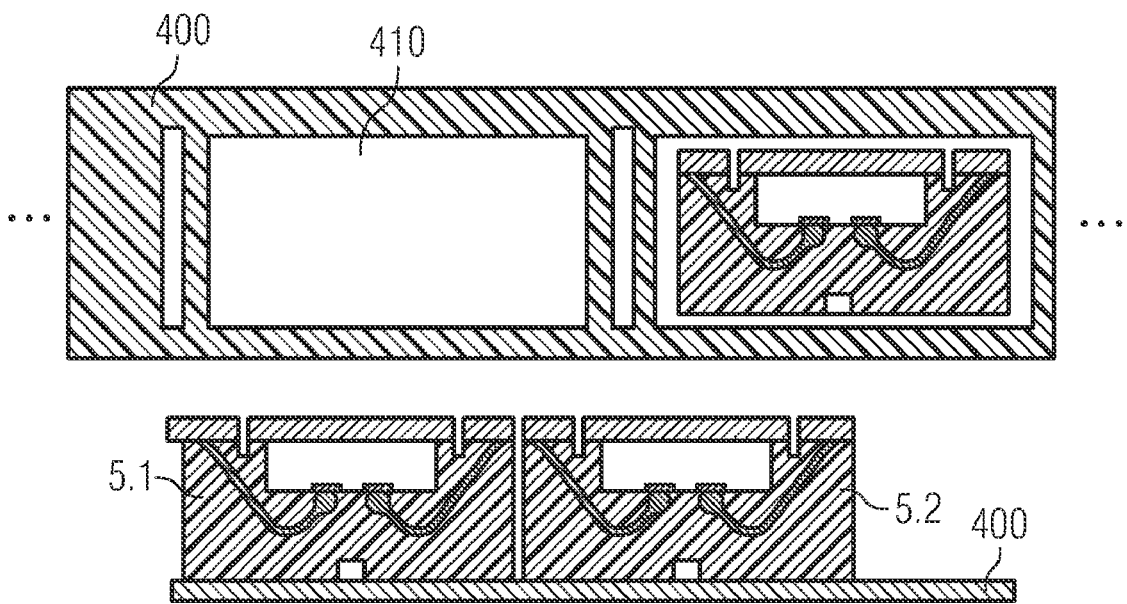

Referring to FIG. 10I, the individual semiconductor chip packages are then packed into a transport tape 400 which can be shipped to the customer or point of use later. In the upper partial picture of FIG. 10I the transport tape 400 is illustrated in a top view. There are only illustrated two segments 410 of the transport tape 400 wherein each segment can be used to receive one semiconductor chip package. The left segment is empty whereas the right segment is occupied with a semiconductor chip package. The semiconductor chip packages can be fixed by suitable means in the segments of the transport tape 400. The transport tape 400 may extend further to the left or to the right and it may include a plurality of segments 410. In the lower partial picture of FIG. 10I a side view of the transport tape 400 is illustrated with two semiconductor chip packages 5.1 and 5.2 fixed into neighboring segments of the transport tape 400.

Referring to FIG. 11, there is illustrated a cross-section representation of an embodiment of a panel. The panel 30 includes a disk-shaped electrically conductive layer 3, multiple semiconductor chips 1B attached to the disk-shaped electrically conductive layer 3, and an encapsulation material 5 encapsulating the semiconductor chips 1B. In one embodiment, the panel as depicted in FIG. 11 was obtained in the method as described in connection with FIGS. 9A-C.

According to one embodiment of the panel as illustrated in FIG. 11, wire bonds are provided for connecting the semiconductor chips 1B with the disk-shaped electrically conductive layer 3.

According to one embodiment of the panel as illustrated in FIG. 11, an adhesive material is provided between each semiconductor chip 1B and the disk-shaped electrically conductive layer 3.

According to one embodiment of the panel as illustrated in FIG. 11, the electrically conductive layer 3 is comprised of a metal layer.

Referring to FIG. 12, there is illustrated a perspective representation of an embodiment of a panel as was already explained in connection with FIG. 10B. The panel 40 includes a disk-shaped electrically conductive layer 3, multiple semiconductor chips (not illustrated) attached to the disk-shaped electrically conductive layer 3, and an encapsulation material 5 encapsulating the semiconductor chips.

It will be appreciated that many of the above described features which were only explained in connection with particular embodiments can also be applied to others of the described embodiments although not explicitly mentioned in the description of the other embodiments.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing multiple semiconductor devices, comprising:
    applying an electrically conductive layer onto a semiconductor wafer;
    structuring the semiconductor wafer to produce multiple semiconductor chips;
    structuring the electrically conductive layer to produce multiple semiconductor devices; and
    structuring the electrically conductive layer to produce multiple contact elements for each semiconductor device.

2. The method of claim 1, wherein structuring the semiconductor wafer comprises at least one of structuring the semiconductor wafer by etching, by sawing, by laser beam irradiation, and by charged particle beam irradiation.

3. The method of claim 1, further comprising:
    structuring the electrically conductive layer after structuring the semiconductor wafer.

4. The method of claim 1, wherein structuring the electrically conductive layer comprises at least one of structuring the electrically conductive layer by etching, by sawing, by laser beam irradiation, and by charged particle beam irradiation.

5. The method according to claim 1, further comprising:
    wire bonding the semiconductor chips before structuring the electrically conductive layer.

6. The method of claim 1, further comprising:
    encapsulating the semiconductor chips with an encapsulation material before structuring the electrically conductive layer.

7. The method of claim 1, further comprising:
wire bonding the semiconductor chips to the electrically conductive layer.

8. A method of producing multiple semiconductor packages, comprising:
applying an electrically conductive layer onto a semiconductor wafer, wherein the electrically conductive layer is a structurally homogeneous layer;
structuring the semiconductor wafer to produce multiple semiconductor chips;
encapsulating the structured semiconductor wafer with an encapsulation material to produce a panel;
structuring the panel to produce multiple semiconductor packages; and
wire bonding the semiconductor chips to the electrically conductive layer.

9. The method of claim 8, wherein structuring the semiconductor wafer comprises at least one of structuring the semiconductor wafer by etching, by sawing, by laser beam irradiation, and by charged particle beam irradiation.

10. The method according to claim 8, wherein structuring the panel comprises at least one of structuring the panel layer by etching, by sawing, by laser beam irradiation, and by charged particle beam irradiation.

11. The method of claim 8, further comprising:
structuring of the panel comprises structuring the electrically conductive layer.

12. The method of claim 8, further comprising:
structuring the electrically conductive layer to produce multiple contact elements in each semiconductor package.

13. A method of fabricating a panel, comprising:
applying an electrically conductive layer onto a semiconductor wafer;
structuring the semiconductor wafer;
encapsulating the structured semiconductor wafer with an encapsulation material; and
wire bonding the semiconductor chips to the electrically conductive layer.

14. The method of claim 13, further comprising:
structuring the semiconductor wafer to produce multiple semiconductor chips.

15. The method of claim 13, further comprising:
applying the electrically conductive layer by using an adhesive material.

16. The method of claim 13, further comprising:
structuring the semiconductor wafer by sawing.

17. A panel, comprising:
a disk-shaped electrically conductive layer, wherein the electrically conductive layer is a structurally homogeneous layer;
multiple semiconductor chips attached to the disk-shaped electrically conductive layer;
an encapsulation material encapsulating the semiconductor chips; and
wire bonds connecting the semiconductor chips with the disk-shaped electrically conductive layer.

* * * * *